United States Patent [19]

Reichardt

[11] Patent Number: 4,688,867
[45] Date of Patent: Aug. 25, 1987

[54] CIRCUIT BOARD WITH INTEGRAL POSITIONING MEANS

[75] Inventor: Manfred Reichardt, Weinsberg, Fed. Rep. of Germany

[73] Assignee: Allied Corporation, Morris Township, Morris County, N.J.

[21] Appl. No.: 818,147

[22] Filed: Jan. 13, 1986

[30] Foreign Application Priority Data

Jan. 19, 1985 [DE] Fed. Rep. of Germany ....... 3501710

[51] Int. Cl.⁴ .............................................. H05K 1/18
[52] U.S. Cl. ................... 439/83 C; 361/401
[58] Field of Search .............. 339/17 E, 17 C, 17 CF, 339/17 R; 361/400, 401, 403, 406; 357/80, 81

[56] References Cited

U.S. PATENT DOCUMENTS

| 3,011,379 | 12/1961 | Corwin | 339/17 CF |
| 3,335,327 | 8/1967 | Damon et al. | 361/401 |
| 4,219,172 | 8/1980 | Murayama | 361/403 |
| 4,361,862 | 11/1982 | Martyniak | 361/401 |
| 4,577,259 | 3/1986 | Latasiewicz et al. | 361/403 |
| 4,598,337 | 7/1986 | Wuthrich et al. | 361/401 |

FOREIGN PATENT DOCUMENTS

| 1071170 | 4/1964 | Fed. Rep. of Germany . | |
| 1816808 | 9/1969 | Fed. Rep. of Germany . | |
| 3222178 | 12/1983 | Fed. Rep. of Germany . | |
| 2185915 | 1/1974 | France | 361/400 |
| 55-123151 | 9/1980 | Japan | 357/80 |

Primary Examiner—Neil Abrams
Attorney, Agent, or Firm—Roger H. Criss

[57] ABSTRACT

A circuit board with circuit paths on the upper and/or lower surface, the conductive paths being adapted to provide a connection between the components located on the surfaces. Positioning elements for the components are provided at the circuit board or, alternatively, are formed in the circuit board. These positioning elements may be in the form of detents or ribs. In addition, an indentation may be provided either as the positioning element or in addition thereto to retain the component.

6 Claims, 4 Drawing Figures

CIRCUIT BOARD WITH INTEGRAL POSITIONING MEANS

BACKGROUND OF THE INVENTION

1. Field of the Invention

This invention relates to a circuit board which is provided on its one surface or its both surfaces with conductive paths which are adapted to provide connections to the components arranged on the circuit board. The invention relates in particular to a circuit board adapted for the use in the SMD art. The term "SMD" refers to "surface mounted devices".

2. Description of the Prior Art

When locating components on a circuit board in accordance with the SMD technique, the components are initially fixed by means of an adhesive or other means at the desired location on the circuit board. After the adhesive has cured the components are be soldered to the circuit board by means of one of the known soldering methods, for example by means of the so-called wave soldering.

The present invention is particularly advantageous when used for circuit boards manufactured according to the so-called dry additive process. The dry additive process is a method according to which the circuit paths are manufactured by pressing conductive particles into a board substrate while using heat.

When locating components on a circuit board in accordance with the prior art positioning method, the precision with which the components are positioned depends to a large degree on the automatic positioning apparatus and also upon the quality of the adhesive connection. It is quite obvious that the positioning of a component on the circuit board in an imprecise position may lead to a circuit board which is equipped with components but which is unfit for use. Another problem with the prior art circuit boards is due to so-called shadow effects during the soldering operation. These shadow effects are caused by the lay-out of the circuit boards.

It would be desirable to overcome the disadvantages of the prior art and to provide for a circuit board which allows high precision positioning of the components. Also, it would be desirable to make the precision of the positioning operation independent of the use of adhesive. In addition, it would be desirable to avoid shadow effects during the soldering operation.

SUMMARY OF THE INVENTION

In accordance with this invention, there is provided a circuit board comprising conductive paths on its upper surface and/or its bottom surface, the conductive paths being adapted to provide connections between components arranged on the circuit board, characterized in that the board is adapted for mounting the components by a surface mount technique and that integrally formed positioning means is provided for the components at at least one of said surfaces of the circuit board and extend into the circuit board.

In accordance with the invention a circuit board is provided having conductive paths on one surface (upper surface) and/or the other surface (bottom surface), the conductive paths being adapted to provide an electrical connection for the components located on the circuit board. Positioning means for the components to be located are formed in or at the circuit board. These positioning means are preferably integral (i.e., form a single piece) with the circuit board. Preferably, the positioning means simultaneously acts as detent elements and causes a holding effect for the components at the surface of the circuit board so that the application of an adhesive and the curing of the adhesive is not necessary. In case that the coefficient of elongation is different between the circuit board and a component instable solder connections have to be expected. To overcome this disadvantage the present invention provides for openings and indentations, respectively, between the points of termination of the components so as to equalize the different elongations caused by the presence of heat.

In accordance with a preferred embodiment of the invention the actual contacting between the circuit paths and the component is provided at a surface which extends perpendicular to the circuit board. As a consequence, even for a high density of components the creation of shadows during the wave soldering operation will be avoided. Further, by arranging the circuit paths in different planes the air and creeping distance is increased.

In accordance with a preferred embodiment of the invention the SMD components are submerged, i.e., they are located in indentations, so that the possibility of the creation of a shadow effect during a wave soldering operation is further reduced, without losing the advantage of precisely positioned components.

DESCRIPTION OF THE PREFERRED EMBODIMENTS

Figure 1:
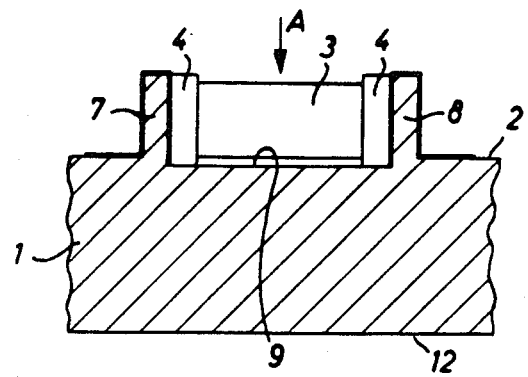
FIG. 1 is a schematic cross-sectional view along line B-C in FIG. 2 of a circuit board with one component located thereon in accordance with the invention.
Figure 2:
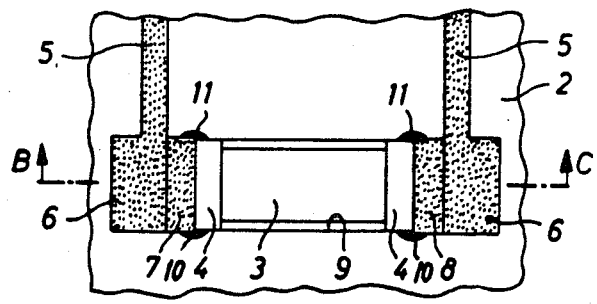
FIG. 2 is a plan view of the circuit board of FIG. 1.

FIGS. 1 and 2 refer to a first embodiment of a circuit board 1 of the invention. The circuit board 1 comprises an upper surface 2 and a bottom surface 12. In the drawing only one component 3 is shown as being placed on the upper surface 2. However, generally a plurality of components is positioned at the upper surface 2. Moreover, also the bottom surface 12 may be equipped with additional components.

Each component 3 comprises two oppositely located termination elements 4 adapted for connection to the conductive paths provided at the upper surface 2.

For the positioning of the components positioning means are integrally provided with the circuit board 1. The positioning means have the form of ribs 7 and 8. Ribs 7 and 8 not only serve for the positioning of the components 3, but also for making contact with these components. For this purpose the conductive paths 5 extend at least to the side walls of the ribs, which project out of the plane of FIG. 2 so that the soldering spots 10 and 11, as shown in FIG. 2, can be formed. The conductive paths 5 are widened adjacent to the ribs 7 and 8 as is shown by reference numeral 6. Preferably the conductive paths extend around the outside wall, the top and the inside wall of the ribs as is shown in FIG. 1.

The spacing of the ribs 7 and 8 may be selected such that a component will be held in a resilient manner between the ribs 7 and 8, after being inserted between the ribs in the direction of arrow A. Consequently, it is not necessary to use an adhesive when positioning the component 3. In addition, as is shown in FIG. 1, an indentation 9 may be provided having a shape which corresponds in substance to the outline of component 3.

Figure 3:
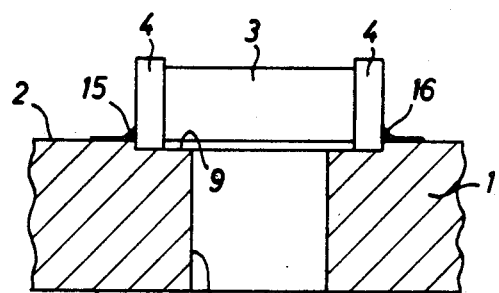
FIG. 3 is a cross-sectional view of a second embodiment of the invention according to which a component is positioned on a circuit board.

FIG. 3 is a sectional view of another embodiment of the invention according to which no ribs 7 and 8 are used; rather, an indentation 9 is provided in the circuit board. The length of the indentation 9 is such that a component 3 inserted into the indentation will be held in its position due to the resilient effect of parts of the circuit board which are in engagement with the termination elements 4 of the component 3. Soldering spots 15 and 16 can be provided in a simple manner between the circuit paths and the termination elements 4 as is shown in FIG. 3. So as to equalize the effect of different coefficients of elongation of the component 3 and the circuit board 1, an opening 17 is provided which provides a connection of the indentation 9 with the other surface, i.e., the bottom surface 12.

Figure 4:
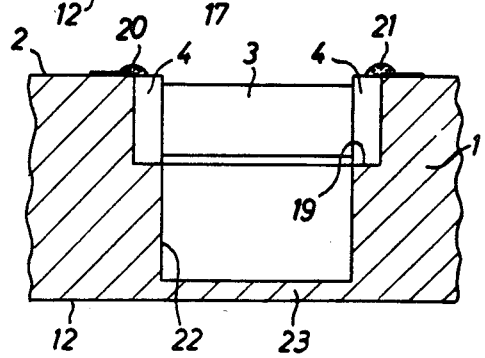
FIG. 4 is a cross-sectional view of another embodiment in accordance with which a component is submerged in the circuit board.

A third embodiment of the invention is shown in FIG. 4. According to this embodiment the component is completely submerged in an indentation 19 so that a special improvement is provided with regard to the avoidance of shadows during the soldering operation. The soldering spots 20 and 21 are practically in alignment with the upper surfaces of the termination elements 4 as is shown in FIG. 4. Adjacent to the indentation 19 a recess 22 is provided which extends towards the bottom surface 12, with a wall portion 23 remaining. The recess 22 serves for the equalization of different coefficients of elongation of the circuit board 1 and the component 3.

Although any suitable circuit board may be used, it is preferred to use a board formed by the dry additive process. A printed circuit board made by the dry additive process is typically a board in which the conductive traces are made by placing grooves in a board with a die and spreading a metal conductive powder on the board. Preferably, the powder is copper in the form of flakes. The powder is compressed in the grooves and heated to cause the copper to anneal into a continuous conductive trace in the grooves. The pressure and temperature are chosen to provide the desired result. Alternatively, the grooving and compressing can be done simultaneously on an ungrooved board on which the flakes are spread. Preferably, the board is made of a heat softenable thermoplastic material, such as a polyetherimide.

Although in the drawings it is depicted that the positioning means is located on one side of the board, it is to be understood that positioning means can also be provided on both sides of the boards, whereby surface mounted devices can be provided on both board surfaces.

The board and the positioning means may be formed together by a plastic injection molding process.

This invention thus provides a circuit board on which components can be mounted by the SMD technique without an adhesive and the components can be precisely positioned. Furthermore, the circuit board design avoids the shadow effects during soldering, and the board is less susceptible to damage due to heat.

I claim:

1. A circuit board comprising conductive paths on its upper surface and/or its bottom surface, said conductive paths being adapted to provide connections between components arranged on said circuit board, characterized in that said board is adapted for mounting said components by a surface mount technique and that positioning means formed integrally with and of the material of the circuit board is provided for the components at at least one of said surfaces of the circuit board and extend out from the circuit board, said positioning means being in the form of elastic ribs projecting away from said at least one surface of the board, said ribs being adapted for mounting of and retaining the appropriate component to said board due to the elastic characteristics of said ribs, said ribs having a top portion and outer and inner facing sides, and said conductive paths extending towards said ribs and over said ribs and being in contact with said top portion and both said outer and inner facing sides so as to be capable of being in electrical contact with termination elements provided on the component.

2. The circuit board of claim 1, characterized in that the circuit board is formed together with the positioning means by means of plastic injection molding.

3. The circuit board as set forth in claim 1, characterized in that said conductive paths are provided with widened portions in the vicinity of said ribs.

4. The circuit board of claim 3 characterized in that an indentation is provided adjacent to said ribs, said indentation having an outline substantially corresponding to the outline of said component, said indentation being provided in said surface of the circuit board and extending therein to a relatively small depth.

5. The circuit board of claim 4, characterized in that two ribs extend from said board and are spaced from one another so as to be able to retain said component therebetween by the elastic nature of said ribs.

6. The circuit board of claim 5, characterized in that said board is formed by a dry additive process.

* * * * *